US007683626B2

(12) United States Patent
Ausserlechner

(10) Patent No.: US 7,683,626 B2
(45) Date of Patent: Mar. 23, 2010

(54) CIRCUIT WITH AN ARRANGEMENT FOR THE DETECTION OF AN INTERRUPTED CONNECTING LINE

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 249 days.

(21) Appl. No.: 11/709,942

(22) Filed: Feb. 22, 2007

(65) Prior Publication Data

US 2007/0210803 A1 Sep. 13, 2007

(30) Foreign Application Priority Data

Feb. 22, 2006 (DE) ...................... 10 2006 008 284

(51) Int. Cl.
*G01R 31/08* (2006.01)
*H02H 3/24* (2006.01)

(52) U.S. Cl. ........................................ 324/522; 361/90

(58) Field of Classification Search ................. 324/522, 324/512, 500, 66, 537, 538; 340/650–652; 361/42, 88, 101; 60/277; 73/114.71; 701/1, 701/107; 702/57–59, 117, 127, 182, 183, 702/185, 176; 714/25, 48, 799
See application file for complete search history.

(56) References Cited

U.S. PATENT DOCUMENTS 3,913,026 A * 10/1975 Koehler ..................... 330/277
5,101,154 A * 3/1992 Hollstein et al. ............ 324/537
5,544,054 A * 8/1996 Kayano et al. ................. 701/1
5,898,107 A * 4/1999 Schenk .................... 73/114.71
7,023,691 B1 * 4/2006 Feight et al. ................ 361/681
7,054,123 B2 * 5/2006 Ausserlechner et al. ........ 361/90
7,265,955 B2 * 9/2007 Fink ........................... 361/42
7,333,915 B2 * 2/2008 Motz .......................... 702/176

FOREIGN PATENT DOCUMENTS

WO WO 02/15392 A2 2/2002
WO WO2004/038882 A1 5/2004

* cited by examiner

*Primary Examiner*—Hoai-An D Nguyen
(74) *Attorney, Agent, or Firm*—Maginot, Moore & Beck

(57) ABSTRACT

A circuit arrangement includes a first and a second supply terminal for application of a supply voltage and an output terminal for providing an output signal. The circuit arrangement additionally includes at least one programmable switch arrangement includes a normally off MOS transistor, which has a load path between a first and second load terminal and a control electrode. A capacitive component, has a first and a second terminal, the first terminal of which is connected to the control electrode of the MOS transistor and the second terminal of which is connected to a control and programming terminal. In this case, the load path of the MOS transistor is connected between the output terminal and one of the supply terminals.

20 Claims, 5 Drawing Sheets

Vdd
61
67
71
65
70
Eval. Circuit
64
63
SENSOR
S65
66
21
51
23
Vin
42
41
DRIVE CIRCUIT
G
D
50
20
M
S
53
Semi. Sw.
52
40 Arrang.
V20
22
62
68
69
GND Vdd
71
70
Eval.
Circuit
67
61
63
Vin
20
68
GND
62
66
D
S
22
21
G
M
Semi. Sw.
Arrang.
41
42
40
64
S65
V20
23
53
69
DRIVE
CIRCUIT
51
52
50
SENSOR
65

Vdd
71
70
Eval.
Circuit
67
61
63
Vin
20
62
68
GND
66
D
S
21
22
G
M
Semi. Sw.
Arrang.
41
42
40
64
S65
V20
23
53
50
DRIVE
CIRCUIT
51
52
SENSOR
65
S50
54

Vdd
67
61
63
62
71
70
Eval. Circuit
GND
68
20
67
21
22
S
D
G
M
Semi. Sw. Arrang.
41
42
40
64
23
53
69
DRIVE CIRCUIT
51
52
50
S65
SENSOR
65

Vdd
GND
DRIVE CIRCUIT
SENSOR
Eval. Circuit
Semi. Sw. Arrang.
S50
S65
G
S
D
M
20
21
22
23
40
41
42
50
51
52
53
54
61
62
63
64
65
67
68
70
71

CIRCUIT WITH AN ARRANGEMENT FOR THE DETECTION OF AN INTERRUPTED CONNECTING LINE

CROSS-REFERENCE TO RELATED APPLICATIONS

This application claims priority from German patent application number 10 2006 008 284.2, filed Feb. 22, 2006, the contents of which is incorporated herein by reference.

FIELD

The present invention relates to a circuit with an arrangement for the detection of an interrupted connecting line.

BACKGROUND

WO 02/15392 A2 describes such a circuit arrangement with a device for the detection of an interruption of a connecting line (OBD, Open Bond Detection). The circuit arrangement has supply terminals for the application of a supply voltage and an output for providing an output signal. In this case, the supply terminals are connected to suitable supply potentials via line connections that are to be monitored with regard to an interruption. For this purpose, a normally on MOSFET is connected between the output of said circuit arrangement and a first one of the supply terminals, said MOSFET being driven in the off state during normal disturbance-free operation. In the event of a failure of the voltage supply due to an interruption of the line connection which is connected to the second one of the two supply terminals, said MOSFET turns on and connects the output of the circuit arrangement to the potential of the first supply terminal, which can be identified as a fault state by a connected evaluation circuit. In said evaluation circuit, for the detection of said fault state, a resistor is usually connected between the output and the potential that is present at the second supply terminal during fault-free operation. Depending on the configuration, said resistor fulfils the function of a pull-up resistor or a pull-down resistor.

Circuit arrangements that demand a functionality for the identification of a line interruption are, by way of example, integrated sensor circuits which are used in motor vehicles and which have, under certain circumstances, long supply lines that must be monitored.

Such sensor circuits are usually realized using CMOS technology. In this case, the production processes are usually optimized for the production of normally off MOS transistors. Normally on transistors can be realized only with difficulty or with high outlay in respect of space, by means of such semiconductor processes.

What is more, there may be the necessity of preparing such circuits both for operation with a pull-up resistor and for operation with a pull-down resistor, with the result that a normally on transistor is to be provided both between the output terminal and the first supply terminal and between the output terminal and the second supply terminal. What is disadvantageous in this case is that when the circuit arrangement is started, directly after application of the supply voltage, a shunt current flows via these two normally on transistors between the supply potential terminals until a drive circuit provides a sufficiently large driving voltage that turns off the two normally on transistors.

SUMMARY

A circuit arrangement according to an embodiment of the invention comprises a first and a second supply terminal for application of a supply voltage and an output terminal for providing an output signal. The circuit arrangement additionally comprises at least one programmable switch arrangement comprising a normally off MOS transistor, which has a load path between a first and second load terminal and a control electrode, and comprising a capacitive component, having a first and a second terminal, the first terminal of which is connected to the control electrode of the MOS transistor and the second terminal of which is connected to a control and programming terminal. In this case, the load path of the MOS transistor is connected between the output terminal and one of the supply terminals.

BRIEF DESCRIPTION OF THE DRAWINGS

Embodiments of the present invention will be explained in more detail below with reference to figures.

In the figures, unless specified otherwise, identical reference symbols designate identical circuit components and component regions with the same meaning.

DETAILED DESCRIPTION

Figure 1:
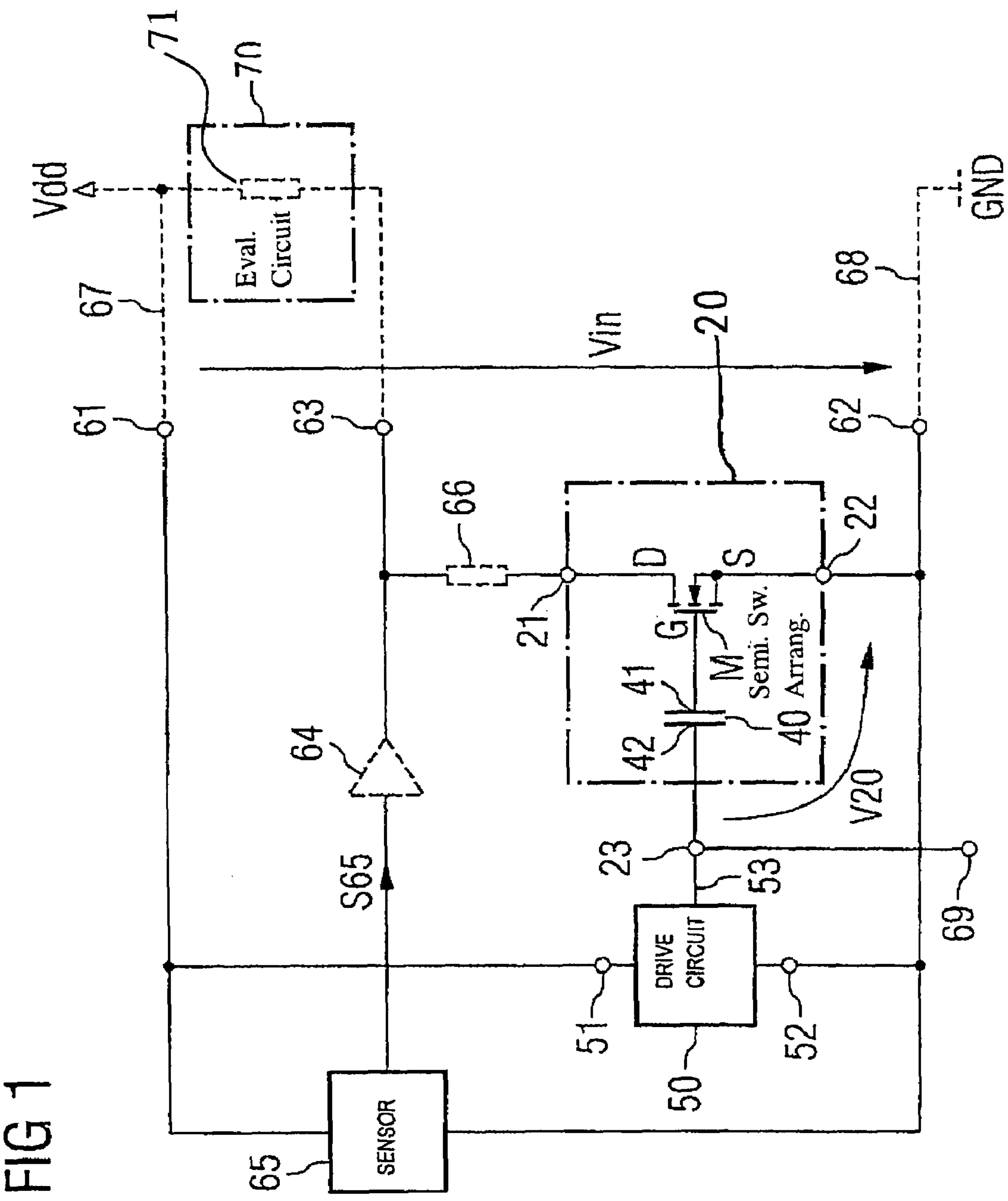
FIG. 1 shows a first embodiment of a circuit arrangement according to the invention, having two supply terminals, an output terminal and an arrangement for the detection of a line interruption with a normally off MOSFET and a capacitive component.

A circuit arrangement according to an embodiment of the invention comprises a first and a second supply terminal for application of a supply voltage and an output terminal for providing an output signal. The circuit arrangement additionally comprises at least one programmable switch arrangement comprising a normally off MOS transistor, which has a load path between a first and second load terminal and a control electrode, and comprising a capacitive component, having a first and a second terminal, the first terminal of which is connected to the control electrode of the MOS transistor and the second terminal of which is connected to a control and programming terminal. In this case, the load path of the MOS transistor is connected between the output terminal and one of the supply terminals.

In the case of this arrangement, the normally off MOS transistor and the capacitive component of the semiconductor switch arrangement, said capacitive component being connected to the control electrode of the MOS transistor, function in the manner of an EEPROM cell. In this case, the control electrode, which determines the conduction behaviour of the MOS transistor, is arranged in floating fashion and insulated from the control and programming terminal by means of the capacitive component. Upon application of a suitable voltage, which is referred to hereinafter as programming voltage, however, charge carriers can tunnel from a semiconductor body in which the MOS transistor is integrated onto the control electrode of the MOS transistor, or charge carriers can tunnel from said control electrode into the semiconductor body. By this means, it is possible to store positive or negative electrical charge on the control electrode, which charge is maintained after the programming voltage is switched off. A semiconductor switch arrangement programmed in this way can behave like a normally on transistor despite the use of a normally off MOS transistor.

The semiconductor switch arrangement "programmed" in the manner explained above turns off if a voltage—designated hereinafter as turn-off voltage—is applied to the programming and control terminal by the drive circuit. Said turn-off voltage is smaller in magnitude than the programming voltage and, in the case of an n-channel MOS transistor programmed in the manner explained above, is likewise a negative voltage between the second terminal of the capacitive component and one of the load terminals.

In the event of a failure of a supply voltage present at the supply terminals, that is to say when the driving voltage is no longer able to generate the turn-off voltage, the at least one semiconductor switch arrangement connected between one of the supply terminals and the output terminal effects a conductive connection between the output terminal and said one of the supply terminals, which can be detected as a fault by an external evaluation circuit connected to the output terminal.

The programmable semiconductor switch arrangement comprising the normally off MOS transistor and the capacitive component can be realized in a simple manner using CMOS technology—in contrast to a normally on transistor.

FIG. 1 shows a first exemplary embodiment of a circuit arrangement having supply terminals 61, 62 and an output terminal 63 and having a functionality for the detection of a line break (Open Bond Detection, OBD) at one of the supply terminals 61, 62.

This circuit arrangement is for example a sensor circuit having a sensor 65, which is supplied by a supply voltage Vin present between the supply terminals 61, 62 and which provides a sensor signal S65. The sensor may be any desired sensor, in particular an acceleration sensor, temperature sensor, moisture sensor, etc. arranged in a motor vehicle. An output of the sensor 65 is connected to the output of the circuit arrangement, with the result that the sensor signal S65 forms an output signal of the circuit arrangement. In this case, the sensor signal S65 may optionally be amplified by an output driver 64 connected between the sensor 65 and the output 63.

During the operation of the sensor circuit illustrated, the first supply terminal 61 is connected to a terminal for a positive supply potential Vdd via a first line connection 67, and the second supply terminal 62 is connected to a terminal for a negative supply potential or reference-ground potential GND via a second line connection 68. During operation, the output 63 of the sensor arrangement is connected to an evaluation circuit 70 (illustrated by broken lines) which evaluates the—if appropriate amplified—sensor signal present at the output.

In order to be able to detect an interruption of the first line connection 67 between the positive supply potential and the first supply terminal 61, a programmable semiconductor switch arrangement 20 is present, which is connected between the output terminal 63 and the second supply terminal 62.

Said semiconductor switch arrangement 20 has a normally off MOS transistor M having a source terminal S and a drain terminal D, which form the load path terminals of said transistor, and having a gate electrode G, which forms the control electrode of said transistor. The load path running between the drain terminal and the source terminal S of the MOS transistor is connected between load terminals 21, 22 of the semiconductor switch arrangement 20.

The programmable semiconductor switch arrangement 20 additionally has a capacitive component 40 having a first and second terminal 41, 42, the first terminal 41 of which is connected to the gate electrode G of the MOS transistor M and the second terminal 42 of which is connected to a programming and control input 23 of the semiconductor switch arrangement 20. In this case, the programming and control input 23 is connected to an output 53 of a drive circuit 50 and to a programming terminal 69 of the circuit arrangement.

The semiconductor switch arrangement 20 illustrated behaves like a MOS transistor, where a current-conducting path between the load terminals can be controlled by application of a control voltage between the control and programming terminal 23 and one of the load terminals, the second load terminal 22 in the example.

The gate electrode of the MOS transistor M is dielectrically insulated from the control and programming terminal 23 by the capacitive component, with the result that charge carriers can be stored on the gate electrode G or in the gate capacitance of the MOS transistor M. The charge stored on the gate electrode G influences the threshold voltage of the semiconductor switch arrangement 20. The threshold voltage of the semiconductor switch arrangement hereinafter denotes the value of the control voltage starting from which a conductive current path forms between the load terminals of the semiconductor switch arrangement 20. If no charge carriers are stored on the gate electrode G, the threshold voltage of the semiconductor switch arrangement 20 corresponds to the threshold voltage of the normally off MOS transistor M.

The MOS transistor M is embodied as an n-conducting MOS transistor in the example. If positive charges are stored on the gate electrode G in the case of this transistor M, then the threshold voltage of the semiconductor switch arrangement 20 decreases compared with the threshold voltage of the transistor M, in which case, given a correspondingly large charge stored on the gate electrode G, the semiconductor switch arrangement 20 undergoes transition to a normally on state, i.e. already turns on at a control voltage V20 of 0V.

An operation for setting the threshold voltage of the semiconductor switch arrangement 20 in which a charge stored on the gate electrode G is altered is referred to hereinafter as "programming" of the semiconductor switch arrangement 20. Such programming can be effected, in a manner that is still to be explained, by application of a programming voltage between the control and programming terminal 23 and one of the load terminals, in the example the second load terminal 22, which is connected to the second supply terminal 62. The programming terminal 69 serves for application of such a programming voltage chosen in such a way that charge carriers tunnel from a semiconductor body in which the MOS transistor M is integrated onto the gate electrode G or tunnel from the gate electrode into the semiconductor body. As a result of this operation, charge carriers are stored on the gate electrode G of the MOS transistor M, and are maintained even after said programming voltage has been switched off, since the gate electrode is dielectrically insulated from the control and programming terminal by means of the capacitive component 40.

A state of the semiconductor switch arrangement 20 in which the latter already turns on at a control voltage of V20=0V, that is to say in which the semiconductor switch arrangement behaves like a normally on MOS transistor, is referred to hereinafter as "programmed" state of the semiconductor switch arrangement 20. The illustrated semiconductor switch arrangement 20 having an n-channel MOS transistor M can be driven in the off state in said programmed state by the application of a control voltage V20 chosen in such a way that it compensates for the effect of the MOS transistor M being driven in the on state, said effect being brought about by the charge stored on the gate electrode G. Said voltage is referred to hereinafter as "turn-off voltage" of the semiconductor switch arrangement 20.

The drive circuit 50 is connected to the first and second supply terminals 61, 62 of the circuit arrangement via supply terminals 51, 52 and it is designed to generate a turn-off voltage for the programmed semiconductor switch arrangement 20 when a supply voltage Vin is present. For this purpose, the drive circuit 50 is realized as a charge pump, for example, which generates from a positive voltage present at the supply terminals 51, 52, at the output 53, a voltage which is negative with respect to the second supply terminal 52 of the drive circuit 50 and thus negative with respect to the second supply terminal of the circuit arrangement 62.

The semiconductor switch arrangement 20 enables, in the programmed state in conjunction with a pull-up resistor 71 connected in the evaluation circuit 70 between the output 63 and the terminal for supply potential Vdd, a detection of an interruption of the line connection between the terminal for the supply potential Vdd and the first supply terminal 61. This functioning for the detection of a line interruption is explained below:

With an intact voltage supply, that is to say when the supply voltage Vin is present between the supply terminals 61, 63, the drive circuit 50 generates a turn-off voltage for the semiconductor switch arrangement 20, as a result of which there is no conductive current path present between the load terminals 21, 22 of the semiconductor switch arrangement 20.

If the voltage supply of the circuit arrangement is then interrupted, for example by the interruption of the supply line 67, the off-state driving of the programmed semiconductor switch arrangement 20 by the drive circuit 50 can no longer be maintained, as a result of which the programmed semiconductor switch arrangement 20 brings about a conductive current path between the output terminal 63 and the second supply terminal 62. In this case, the pull-up resistor 71 pulls the potential at the output to the value of the potential at the second supply terminal 62. In a manner that is not specifically illustrated, the evaluation circuit 70 evaluates the potential at the output 63 and identifies the second supply potential at the output 63 as a fault since the sensor 65 and, if appropriate, the driver circuit 64 are chosen such that the output signal 63 cannot fall as far as the value of the lower supply potential 62 during disturbance-free operation.

The programming terminal 69 may be a terminal that is accessible to a user of the circuit arrangement, in order to give a user the opportunity to program the semiconductor switch arrangement according to said user's requirements or to leave it in an unprogrammed, i.e. permanently blocking, state.

However, the programming terminal 69 may also be a terminal that is accessible only to the manufacturer of the circuit arrangement, which is usually integrated on a chip. In this case, the programming of the semiconductor switch arrangement may be effected together with the test of the circuit arrangement whilst still at the wafer level, i.e. at a point in time before a wafer on which a plurality of chips (referred to as dies) which contain a circuit according to FIG. 1 are arranged is actually divided into the individual chips. In this case, the programming terminal may be realized as a so-called "test pad", which is no longer accessible after packaging of the chip into a housing. This procedure has the advantage that after packaging, the charge of the gate electrode G can no longer be changed by mistake, e.g. through ESD influences, because the test pad is not bonded and is therefore insulated from the outside world.

Figure 2:
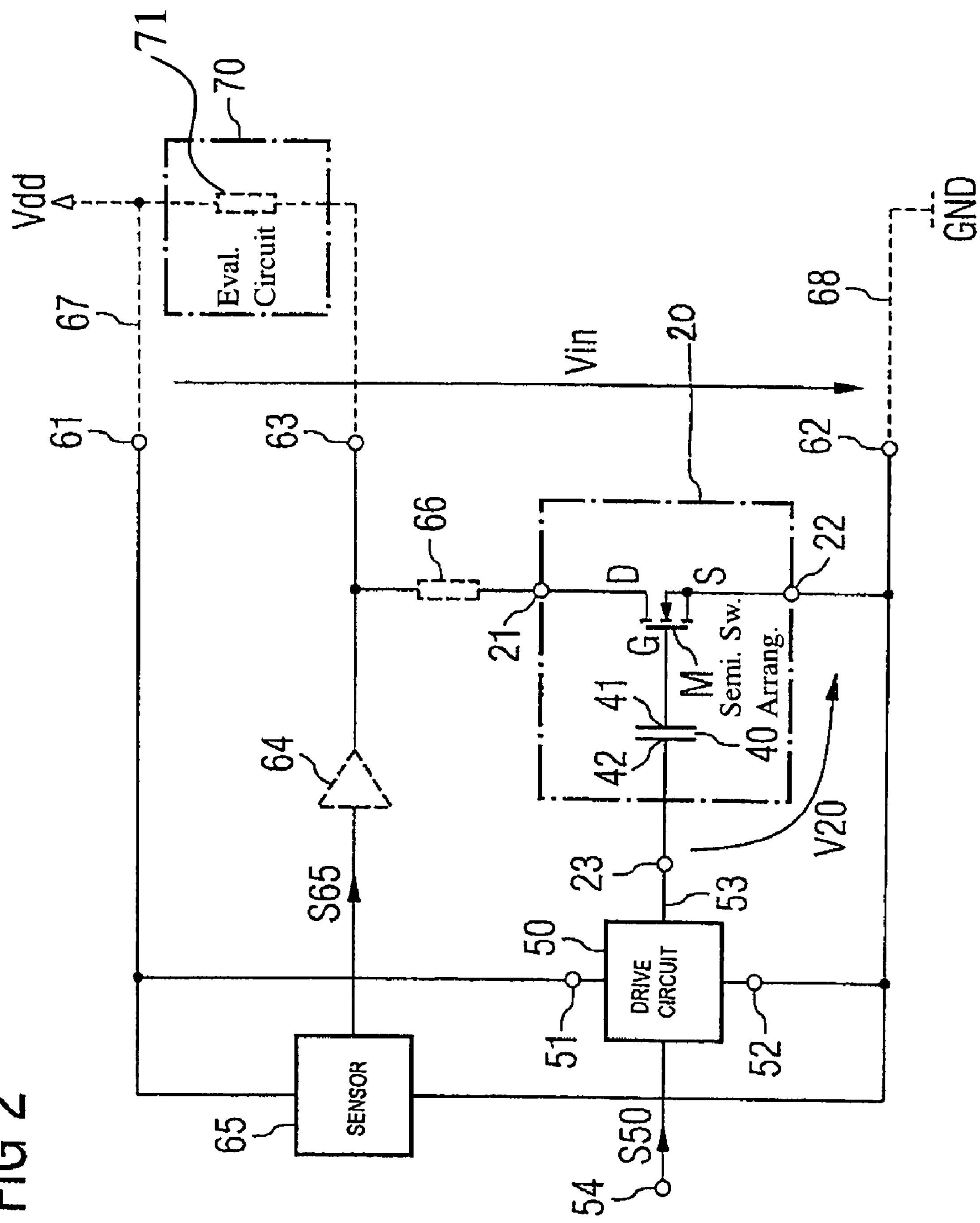
FIG. 2 shows a modification of the embodiment illustrated in FIG. 1.

FIG. 2 shows a modification of the circuit arrangement illustrated in FIG. 1, in which the drive circuit 50 is simultaneously embodied as a programming circuit in order optionally, in accordance with a control signal S50 that can be fed in via a control input 54, to generate either a programming voltage for the programming of the semiconductor switch arrangement 20 or a turn-off voltage for off-state driving of the programmed semiconductor switch arrangement at the output 53 of said drive circuit.

In the case of a MOS transistor M embodied as an n-channel MOSFET, the programming voltage for storing positive charge carriers on the gate electrode G and the turn-off voltage for turning off a programmed semiconductor switch arrangement are in each case negative voltages between the programming and control terminal 23 and the second load terminal 22. In this case, the programming voltage is greater in magnitude than the turn-off voltage.

The programming and drive circuit 50 may have, in a manner that is not specifically illustrated, a charge pump for generating a voltage that is negative relative to its second supply terminal 52, and a voltage divider for providing two different voltages. A changeover is made between these two voltages under the control of the control signal S50.

In the case of this circuit arrangement in accordance with FIG. 2, the user of the circuit arrangement can program the semiconductor switch arrangement 20 by application of a suitable control signal "on-chip".

In order to afford a better understanding of the programming operation explained above, the basic construction of the semiconductor switch arrangement 20 comprising the MOS transistor M and the capacitive component 40 is explained below with reference to FIG. 3.

Figure 3:
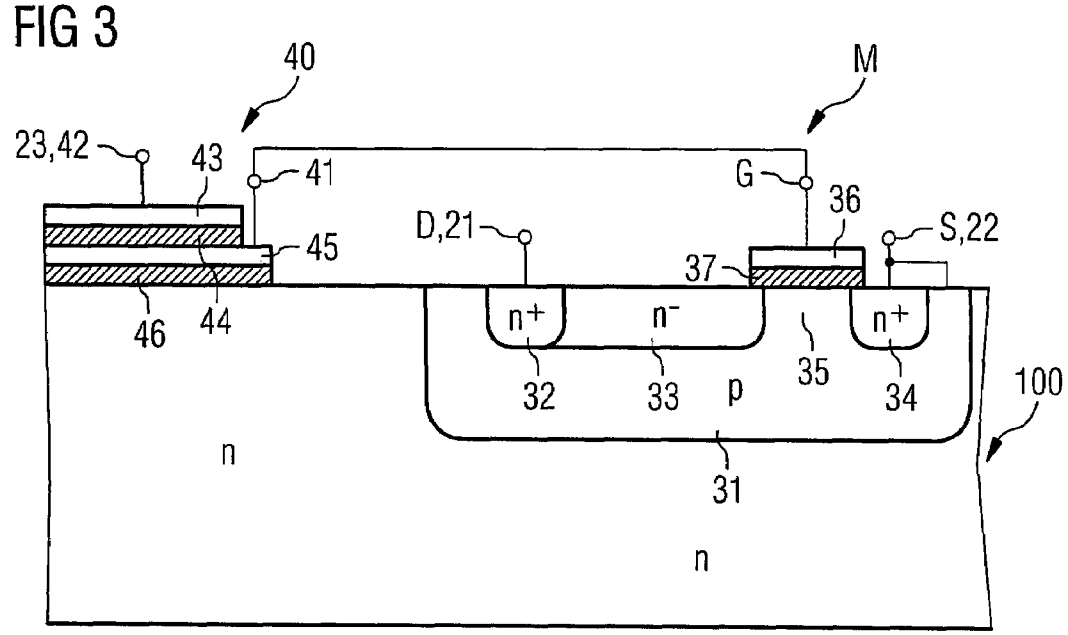
FIG. 3 shows a cross section through a semiconductor body in which a programmable semiconductor switch arrangement comprising a MOS transistor and a capacitive component is integrated.

FIG. 3 shows an excerpt from a semiconductor body 100, in which the MOS transistor M is integrated. Further circuit components of the circuit arrangements illustrated in FIGS. 1 and 2 may also be realized in said semiconductor body 100 in a manner that is not specifically illustrated. In the example, the MOS transistor is realized as an n-conducting MOSFET and has an n-doped drain zone 32 and an n-doped source zone 34, which are arranged in a manner spaced apart from one another in the semiconductor body 100. The source zone 34 is connected to the source terminal S and the drain zone 32 is connected to the drain terminal D, which are only illustrated schematically in FIG. 2. A p-doped body zone 35 is arranged between the source and drain zones 32, 34. A gate electrode 36, which is connected to the gate terminal G is insulated from the semiconductor body 100 by a gate dielectric layer 37 and runs adjacent to the body zone 35 between the source zone 34 and a drift zone 33, which is doped more weakly than the drain zone 32 and adjoins the drain zone 32. Said drift zone 33 is optionally present and serves for increasing the dielectric strength of the component. In the absence of said drift zone 33, the gate electrode runs adjacent to the body zone 35 between source and drain zones 34, 32.

In the example illustrated, the semiconductor body 100 has an n-type basic doping. In this case, the body zone 35 is part of a p-doped well 31 which is introduced into the semiconductor body 100 and which surrounds the source, drain and drift zones 32, 33, 34 within the semiconductor body 100. It should be pointed out that the semiconductor body 100 may also have a p-type basic doping. In this case, the source, drain and drift zones 32, 33, 34 can be introduced directly into the semiconductor body. In this case, the body zone 35 may be formed by a region having the basic doping of the semiconductor body.

In the case of the normally off MOS transistor M, the source zone 34 and the body zone 35 are short-circuited in a known manner, which is only illustrated schematically in FIG. 3.

Referring to FIG. 3, the capacitive component 40 is preferably integrated in or on the same semiconductor body 100 as the MOS transistor M. In this case, the capacitive component 40 may be arranged in a manner spaced apart from the MOS transistor M and is realized as a plate capacitor, for example. Said component comprises two electrically conductive layers 43, 45 which comprise polysilicon, for example, and which are isolated from one another by a dielectric layer 44. Said electrically conductive layers form in each case one of the capacitor plates of the capacitive component 40 which are connected to the first and second terminals 41, 42 (only illustrated schematically). The electrically conductive layers are arranged on a surface of the semiconductor body 100, for example, and insulated from the semiconductor body 100 by a further dielectric layer or insulation layer 46.

In the basic state or initial state of the MOS transistor M, no charge carriers are stored on its gate electrode 36. In this case, a charge carrier flow onto the gate electrode G is prevented by the capacitive component 40, one terminal 41 of which is connected to the gate electrode G, which is illustrated schematically in FIG. 3. Through application of a sufficiently high programming voltage, however, charge carriers can tunnel in accordance with the Fowler-Nordheim tunnel effect through the gate insulation layer 37 from the semiconductor body 100 onto the control electrode 36 or from the control electrode 36 into the semiconductor body 100.

In order to program the semiconductor switch arrangement with an n-channel MOSFET M, a negative voltage is required between the programming and control terminal 23, which corresponds to the second terminal 42 of the capacitive component 40, and the body zone 35, from which the charge carriers tunnel onto the gate electrode G, 36. The body zone 35 is thereby at a higher ("more positive") electrical potential than the gate electrode 36, whereby electrons tunnel from the control electrode 36 through the gate dielectric layer 37 into the body zone 35. After the programming voltage has been switched off, the gate electrode 36 remains positively charged, so that after the programming voltage has been switched off, an inversion channel and thus a conductive channel is permanently formed below the gate insulation layer 37 in the body zone 35. After the programming voltage has been switched off, the MOS transistor M thus behaves like a normally on transistor, the capacitive component 40 preventing the charge carriers stored on the gate electrode 36 from being able to flow away. The gate dielectric layer 37 prevents the stored charge carriers from flowing away in the direction of the semiconductor body 100.

The tunnel effect for "programming" commences at a field strength of 1 GV/m over the gate dielectric layer 37. In the case of a MOS transistor designed for a gate-source voltage of 5V, the thickness of the gate dielectric layer 37 is 15 nm, for example, with the result that a tunnel effect commences at a programming voltage having a magnitude of 15V.

In the case of the component illustrated in FIG. 3, the source zone 34 and the body zone 35 are short-circuited (illustrated schematically) with the result that the programming voltage can be applied between the programming and control terminal 23 and the source terminal S.

When an n-channel MOSFET is used, the turn-off voltage is likewise a negative voltage, but smaller in comparison with the programming voltage, between the second terminal 42 of the capacitive component 40 and the source zone 34 and the body zone 35. This voltage counteracts the production of the conductive channel by the charge carriers stored on the control electrode (36 in FIG. 3), with the result that the MOSFET M turns off when said turn-off voltage is applied.

It goes without saying that a p-conducting MOS transistor can also be used as MOS transistor M of the semiconductor switch arrangement 20. Such a p-conducting transistor is obtained if, in the case of the component in accordance with FIG. 3, the n-conducting zones are replaced by p-conducting zones and the p-conducting zones are replaced by n-conducting zones. A p-MOS transistor is programmed by application of a positive programming voltage between the second terminal 42 of the capacitive component 40 and the body zone 35 in order to behave like a normally on transistor. Upon application of the programming voltage, electrons tunnel from the body zone 35, which is n-doped in the case of this component, onto the gate electrode in order, after the programming voltage has been switched off, to permanently provide for the formation of a conductive channel between the source zone 34 and the drain zone 32 in the body zone 35.

Figure 4:
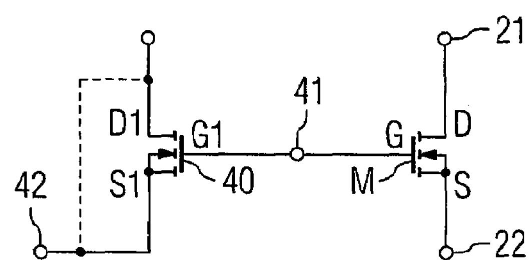
FIG. 4 shows a possibility for realizing the programmable semiconductor switch arrangement using a MOS transistor as a capacitive component.

Referring to FIG. 4, in one embodiment of the programmable semiconductor switch arrangement, provision is made for using the gate capacitance of a MOS transistor for the capacitive component 40, which capacitively decouples the gate electrode G of the MOS transistor M, said gate electrode being arranged in floating fashion. In this case, the gate terminal G1 of said transistor forms the first terminal 41 of the capacitive component 40, said first terminal being connected to the gate terminal G of the MOS transistor M. The source terminal S1 of said MOS transistor, which is preferably short-circuited with the body zone thereof, forms the second terminal of the capacitive component 42. In this case, there is also the possibility of short-circuiting the drain terminal D1 of the MOS transistor with the source terminal S1, which is illustrated in a dashed manner in FIG. 4. As an alternative, there would also be the possibility of using only the body terminal of the MOS transistor as the second terminal of the capacitive component, since most of the gate capacitance is formed between the gate electrode and the body zone.

Figure 5:
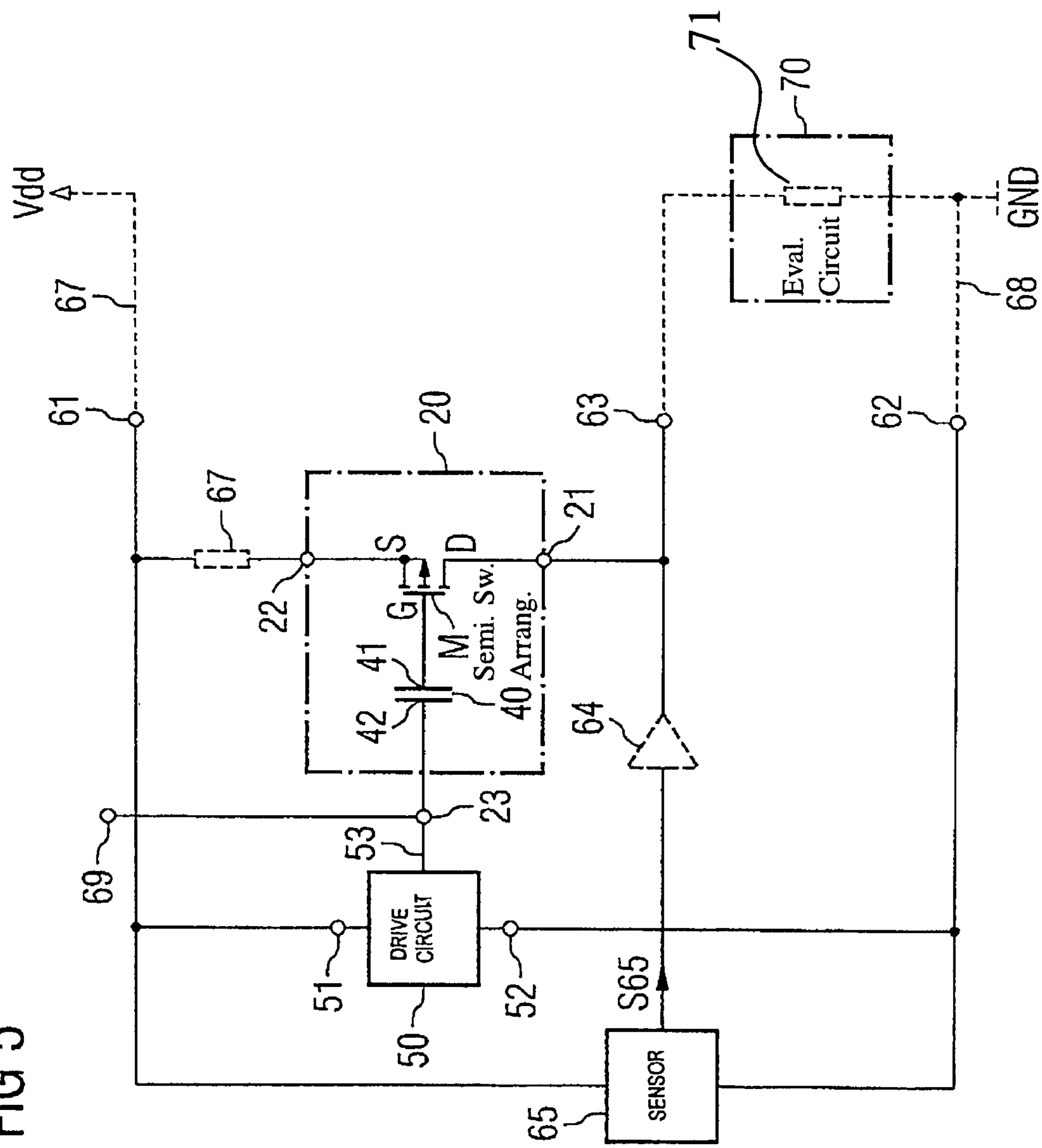
FIG. 5 shows a modification of the circuit arrangement illustrated in FIG. 4.

FIG. 5 shows a modification of the circuit arrangement illustrated in FIG. 1, which differs from that illustrated in FIG. 1 by virtue of the fact that the programmable semiconductor switch arrangement 20 is connected between the first supply terminal 61 for the positive supply potential Vdd and the output terminal 63.

The semiconductor switch arrangement 20 serves, together with a pull-down resistor 72 connected in the evaluation circuit 70 between the output 63 of the circuit arrangement and reference-ground potential GND, for the detection of an interruption of the connecting line 68 between the reference-ground potential GND and the second supply terminal 62. This functionality is explained below under the assumption that the MOS transistor M of the semiconductor switch arrangement 20 is in the programmed state:

With an intact voltage supply, that is to say when the supply voltage Vin is present between the supply terminals 61, 63, the drive circuit 50 generates a turn-off voltage for the semiconductor switch arrangement 20, as a result of which there is no conductive current path present between the load terminals 21, 22 of the semiconductor switch arrangement 20.

If the voltage supply of the circuit arrangement is interrupted by a break of the connecting line 68 to the reference-ground potential terminal, then the drive circuit 50 can no longer provide the turn-off voltage for the MOS transistor M, as a result of which the programmed semiconductor switch arrangement 20 effects a conductive current path between the first supply terminal 61 and the output terminal 63. By means of the pull-down resistor 72 of the evaluation circuit 70, the potential at the output is therefore pulled approximately to the value of the positive supply potential Vdd, which is identified as a fault by the evaluation circuit 70 in a manner that is not specifically illustrated.

In the case of the circuit arrangement according to FIG. 5, the MOS transistor M of the semiconductor switch arrangement 20 is embodied as a p-conducting MOSFET, the load path of which is connected between the load terminals 21, 22 of the semiconductor switch arrangement 20.

Figure 6:
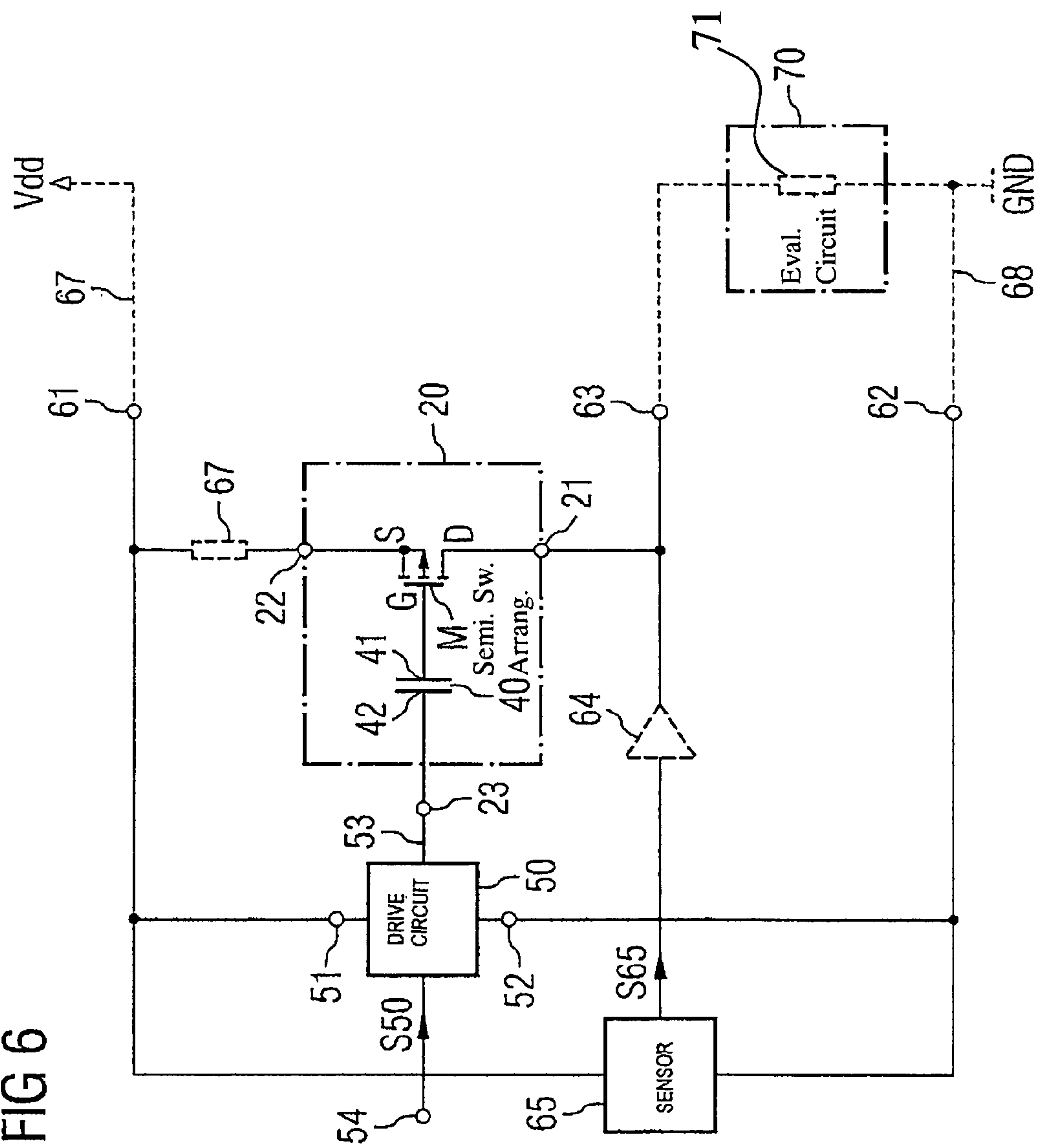
FIG. 6 shows a modification of the circuit arrangement illustrated in FIG. 5.

The programming of said p-MOSFET M functions in a manner corresponding to the programming of the n-MOSFET explained above with reference to FIG. 1, with the difference that, for the programming of the p-MOSFET in accordance with FIG. 6, a positive voltage is to be applied between the second terminal of the capacitive component 40 and the source and body terminal of the MOSFET M in order thereby to accumulate negative charge carriers on the gate electrode of said MOSFET. Accordingly, the turn-off voltage provided by the drive circuit 50 after the programming of the MOS transistor M in order to drive said MOSFET M in the off state during normal operation is a positive voltage between the programming and control terminal 23 and the source terminal of the MOSFET M.

The programming voltage can be applied to the semiconductor switch arrangement via the programming terminal 69 in a manner corresponding to the explanations with respect to FIG. 1.

Furthermore, in a manner corresponding to the explanations with respect to FIG. 2, there is also the possibility of realizing the drive circuit such that the latter generates the programming voltage on-chip in accordance with a control signal S50. Such a circuit arrangement is illustrated in FIG. 6.

In the case of the circuit arrangements explained above, a protective resistor 66 (FIG. 5), 67 (FIG. 6) is preferably connected in series with the MOS transistor M.

In a manner that is not specifically illustrated, there is also the possibility of providing two programmable semiconductor switch arrangements 20 in the circuit arrangement, namely one corresponding to the arrangement in FIGS. 5 and 6 between the first supply terminal 61 and the output 63 and the other corresponding to the arrangement in FIGS. 1 and 2 between the output 63 and the second supply terminal 62. In the case of such a circuit arrangement, there is then the possibility of operating it either with a pull-up resistor (cf. FIGS. 1 and 2) or with a pull-down resistor (cf. FIGS. 5 and 6). For operation with a pull-up resistor, only the arrangement which is connected between the first supply terminal 61 and the output 63 is to be programmed in this case, while for operation with a pull-down resistor, the arrangement which is connected between the output 63 and the second supply terminal 62 is to be programmed.

It should be pointed out that a “programmed” semiconductor switch arrangement can also be “erased” again, i.e. returned to the unprogrammed initial state again, by application of a programming voltage with an opposite sign.

At the end of the production process for the normally off MOS transistor with a floating gate electrode, charge carriers may already be stored on the gate electrode. In this case, there is the possibility of discharging the floating gate electrode of the normally off MOS transistor as early as at the end of the production process whilst still at the factory. This may either be effected by application of a voltage explained above using a test pad. Furthermore, the discharge may also be effected by UV irradiation before the semiconductor chip containing the MOS transistor is packaged into a housing.

What is claimed is:

1. A circuit arrangement comprising:

a first supply terminal and a second supply terminal configured to apply a supply voltage;

an output terminal configured to provide an output signal;

at least one programmable switch arrangement comprising a normally off MOS transistor, the MOS transistor including a load path between two load terminals and including a control electrode, the load path of the MOS transistor connected between the output terminal and the first supply terminal or the second supply terminal;

a capacitive component including a first terminal and a second terminal, the first terminal connected to the control electrode of the MOS transistor and the second terminal connected to a control and programming terminal; and an evaluation circuit coupled to the output terminal to identify a fault condition at the output terminal.

2. The circuit arrangement as claimed in claim 1, the circuit arrangement further comprising a drive circuit connected between the first supply terminal and the second supply terminal, the drive circuit including an output connected to the control and programming terminal.

3. The circuit arrangement as claimed in claim 2, wherein the drive circuit is configured to apply a programming voltage to the control and programming terminal such that charge carriers are permanently stored on the control electrode of the MOS transistor.

4. The circuit arrangement as claimed in claim 1, wherein the at least one programmable switch arrangement comprises a first programmable semiconductor switch arrangement and a second programmable semiconductor switch arrangement, wherein the first programmable semiconductor switch arrangement is connected between the first supply terminal and the output terminal, and wherein the second programmable semiconductor switch arrangement is connected between the output terminal and the second supply terminal.

5. The circuit arrangement as claimed in claim 4, wherein the MOS transistor of the first semiconductor switch arrangement is a p-conducting MOS transistor, and in which the MOS transistor of the second semiconductor switch arrangement is an n-conducting MOS transistor.

6. The circuit arrangement as claimed in claim 1, wherein at least the MOS transistor and the capacitive component of the programmable semiconductor switch arrangement are integrated in a common semiconductor body.

7. The circuit arrangement as claimed in claim 1, wherein the capacitive component is a MOS transistor.

8. The circuit arrangement as claimed in claim 1, wherein the normally off MOS transistor is in a non-conductive state when the first supply terminal provides the supply voltage in an uninterrupted manner.

9. A method of detecting an interrupted connecting line comprising:

applying a supply voltage between a first supply terminal connected to a first connecting line and a second supply terminal connected to a second connecting line;

providing an output signal at an output terminal;

providing a programmable switch arrangement comprising a normally off MOS transistor and a capacitive component, the MOS transistor including a control electrode and a load path, the load path of the MOS transistor connected between the output terminal and the second supply terminal, the capacitive component connected between the control electrode of the MOS transistor and a control and programming terminal;

applying a voltage to the control and programming terminal; and identifying a fault condition at the output terminal.

10. The method of claim 9 wherein the step of applying a voltage comprises applying a turn-off voltage to the programming and control terminal by a drive circuit, the drive circuit including an output connected to the control and programming terminal.

11. The method of claim 9 wherein the MOS transistor is a p-conducting MOS transistor.

12. The method of claim 9 wherein the MOS transistor is an n-conducting MOS transistor.

13. The method of claim 9 wherein at least the MOS transistor and the capacitive component of the programmable switch arrangement are integrated in a common semiconductor body.

14. The method of claim 9 wherein the capacitive component is a MOS transistor.

15. The method of claim 9 wherein the step of applying a voltage comprises applying a programming voltage to the control and programming terminal by a drive circuit such that charge carriers are permanently stored on the control electrode of the MOS transistor.

16. A circuit arrangement comprising:

a first supply node and a second supply node configured to apply a supply voltage; an output node configured to provide an output signal;

a drive node configured to apply a programming voltage;

at least one programmable switch arrangement comprising a normally off transistor including a load path and a control electrode, the load path of the transistor connected between the output node and the first supply node or the second supply node;

means for dielectrically insulating the control electrode of the transistor from the drive node, the means for dielectrically insulating connected between the control electrode and the drive node; and an evaluation circuit coupled to the output node to identify a fault condition at the output node.

17. The circuit arrangement as claimed in claim 16, the circuit arrangement further comprising a drive circuit connected between the first supply node and the second supply node, the drive circuit including an output connected to the drive node.

18. The circuit arrangement as claimed in claim 16, wherein at least the transistor and the means for dielectrically insulating are integrated in a common semiconductor body.

19. The circuit arrangement as claimed in claim 16 further comprising a sensor connected to the first supply node, the sensor configured to provide a sensor signal to the output node.

20. The circuit arrangement as claimed in claim 17, wherein the drive circuit is configured to apply the programming voltage to the drive node such that charge carriers are permanently stored on the control electrode of the transistor.

* * * * *